US008054694B2

(12) United States Patent
Racape

(10) Patent No.: US 8,054,694 B2
(45) Date of Patent: Nov. 8, 2011

(54) VOLTAGE GENERATOR FOR MEMORY ARRAY

(75) Inventor: Emmanuel Racape, Aix en Provence (FR)

(73) Assignee: Atmel Corporation, San Jose, CA (US)

( * ) Notice: Subject to any disclaimer, the term of this patent is extended or adjusted under 35 U.S.C. 154(b) by 211 days.

(21) Appl. No.: 12/410,385

(22) Filed: Mar. 24, 2009

(65) Prior Publication Data

US 2010/0246282 A1    Sep. 30, 2010

(51) Int. Cl.
*G11C 5/14* (2006.01)
(52) U.S. Cl. ............... 365/189.09; 365/189.08; 365/191; 365/202
(58) Field of Classification Search ............. 365/185.11, 365/185.19, 189.09, 206, 189.08, 20
See application file for complete search history.

(56) References Cited

U.S. PATENT DOCUMENTS

| | | | | |
|---|---|---|---|---|
| 6,137,343 | A * | 10/2000 | Matano | 327/535 |
| 6,385,107 | B1 * | 5/2002 | Bedarida et al. | 365/206 |
| 7,046,076 | B2 | 5/2006 | Daga et al. | |
| 2008/0055991 | A1 * | 3/2008 | Kim et al. | 365/185.11 |

* cited by examiner

*Primary Examiner* — Anh Phung
*Assistant Examiner* — Hien Nguyen
(74) *Attorney, Agent, or Firm* — Fish & Richardson P.C.

(57) ABSTRACT

A high voltage may be generated for programming memory cells in a memory array. A middle voltage may also be generated for reading memory cells in the memory array. Control logic and switches may be used to select between the high voltage and the middle voltage. A first oscillator generates clock signals at a high frequency for generating the voltages, and a low frequency oscillator may be used to generate pulses at a lower frequency than the first oscillator to allow the first oscillator to operate only during such pulses to conserve power during a stand-by mode of operation to maintain the middle or medium voltage.

20 Claims, 5 Drawing Sheets

VOLTAGE GENERATOR FOR MEMORY ARRAY

BACKGROUND

As advanced technologies allow higher density memory devices, power supplies may also be decreasing, making it difficult to optimize the speed at which data in the memory devices may be read. This is especially true for EEPROM and FLASH memory, which utilize high internal voltage supplies for programming and erasing memory cells. The size of high voltage transistors used in programming and erasing does not shrink while other devices in the memory shrink due to the need for such high voltage transistors to continue to handle the high voltages. When not programming or erasing or reading memory cells, the memory may be in a standby mode during which the such high voltages are not generated in order to conserve power and reduce heat generation.

The access time of a memory may depend on the memory cell current during a read operation, and the speed of sense amplifiers that sense the memory cell current. The access time is thus also dependent on the speed of sense amplifiers. The current from a memory cell is provided by applying voltages to a bit line and a word line used to access the memory cell. A boost structure may be used to generate a middle voltage to speed the access, but generation of the middle voltage take time.

In prior memory devices, bit line selection is performed by a bit line select circuit that couples a bit line to a sense amplifier. Each memory cell is coupled to a sense amplifier by a high voltage transistor and a low voltage transistor. To make access quicker, prior solutions focused on increasing the width of high voltage transistors. This led to increased areas and a corresponding decrease in memory density. Further, the supply voltage decreased while the threshold voltage of an N transistor remained the same thing, so bit line voltages became too weak, resulting in bad characteristics on the sense amplifiers. Strong parasitic capacitances due to larger size transistors also resulted.

Word line drivers charge word lines with the help of a vboost structure to start cell current flow. As supply voltages decrease, the drive is too poor to ensure a good discharge of the word line through a transistor. A simple doubler has been used to generate higher voltages on the word line, but even more than double the voltage, such as a tripling of the voltage, may be needed. This may result in a strong increase in the rise time and a commensurate risk of damages on the functionality of a read operation at low Vdd.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

In various embodiments, a middle voltage is generated prior to a read operation of a memory device. The middle voltage may be maintained as a stable voltage despite the appearance of intrinsic leakage currents due to advanced technologies facilitating increased circuit densities. During standby when no read or write operations are occurring, consumption of power does not increase. The middle voltage is thus available to be applied in a read operation.

A high voltage may be generated for programming memory cells in a memory array. A middle voltage may also be generated for reading memory cells in the memory array. Control logic and switches may be used to select between the high voltage and the middle voltage. A first oscillator generates clock signals at a high frequency for generating the voltages, and a low frequency oscillator may be used to generate pulses at a lower frequency than the first oscillator to allow the first oscillator to operate only during such pulses to conserve power during a stand-by mode of operation to maintain the middle or medium voltage.

Figure 1:
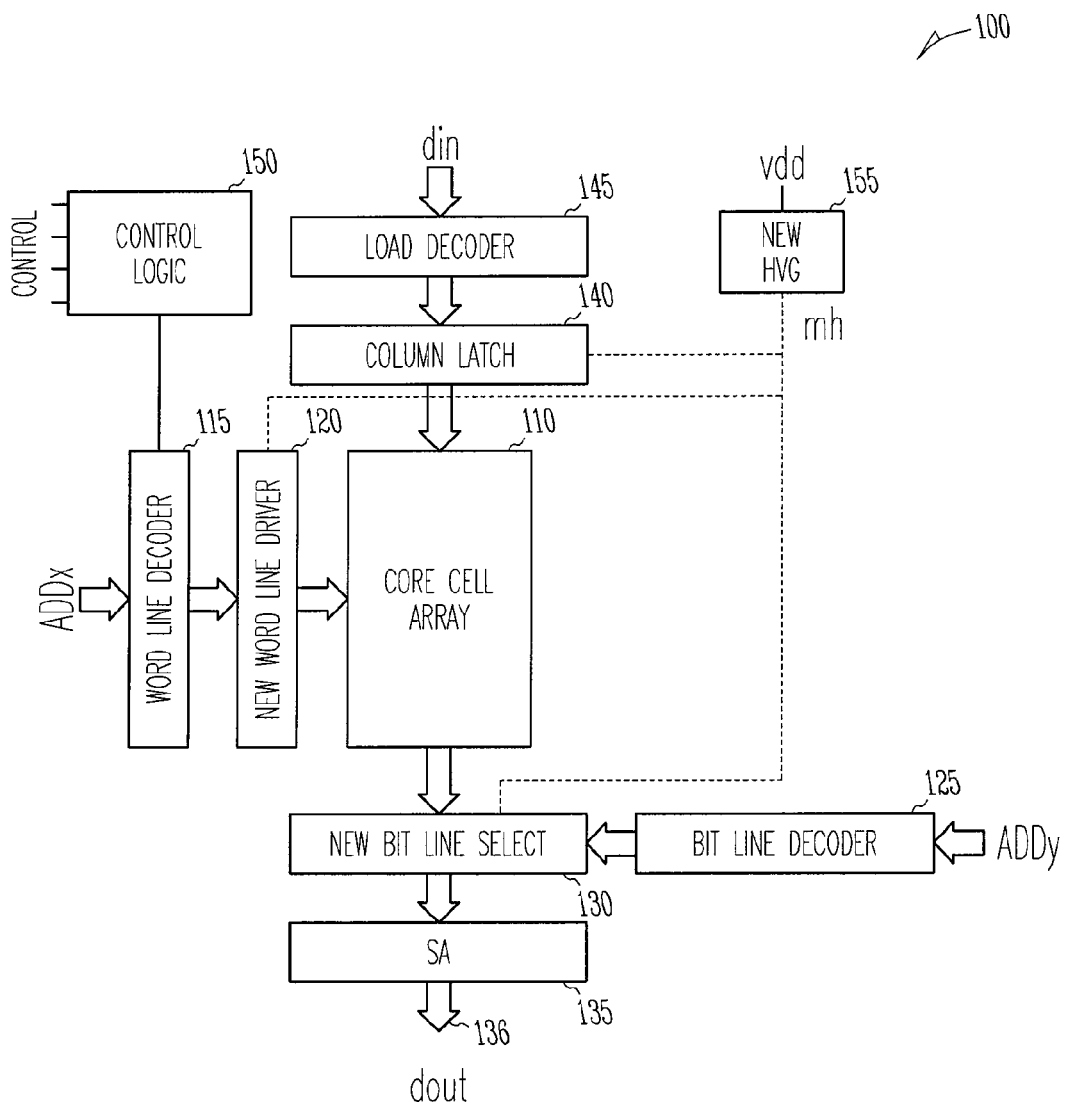
FIG. 1 is a block diagram of a memory device according to an example embodiment.

FIG. 1 is a block diagram of a memory device 100 according to an example embodiment. Memory device 100 includes a memory array 110 that has multiple memory cells in an array addressable by word lines and bit lines. A word line decoder 115 for pre-decoding to select word lines, and word line drivers 120 are coupled to the memory array 110. A bit line decoder 125 also provides pre-decoding to select bit lines via a bit line select module 130. A module including a sense amplifier 135 and data output path 136 is connected to bit line select 130.

A column latch 140 coupled to array 110 serves to store input data from a load decoder 145 before starting a memory array programming operation. Control logic 150 is used to control the word line decoder 115, sense amplifier module 135 and bit line decoder 125. A high voltage generator 155 generates various voltages to program memory cells in array 110, read data with read operations, and maintain the memory cells in a stand-by mode of operation. The high voltage generator 155 generates a stable middle voltage that may be ready to be applied in a read operation. The voltages may be provided to various modules including but not limited to column latch 140, word line drivers 120 and bit line select 130.

Figure 2:
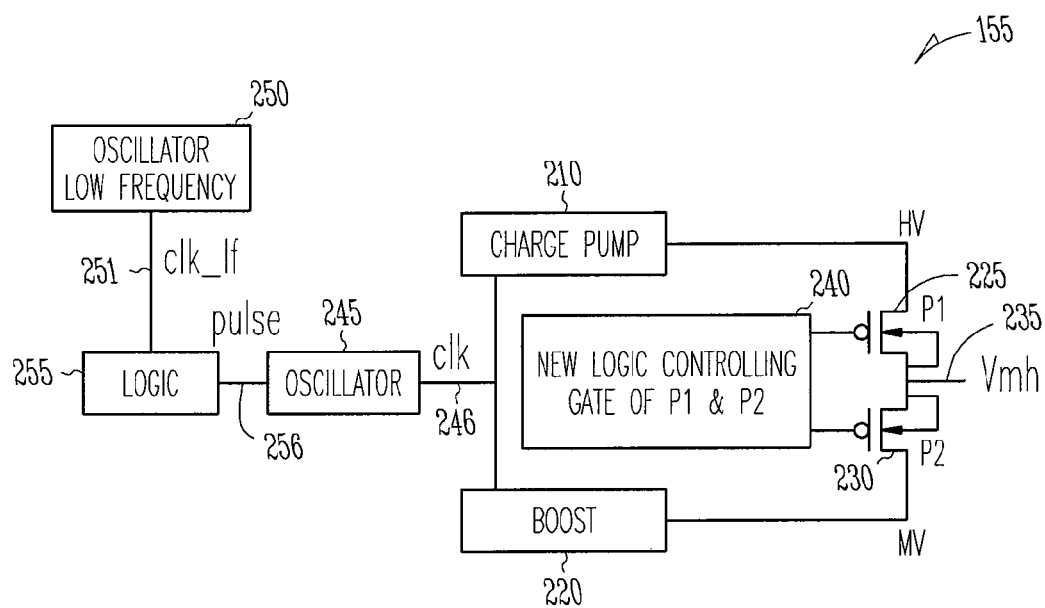
FIG. 2 is a block diagram of a voltage generator structure for the memory device of FIG. 1 according to an example embodiment.

FIG. 2 is a block diagram of a voltage generator 155, showing further details regarding generation of the various voltages. Voltage generator 155 includes a charge pump 210 that generates a high voltage to program memory cells, and a boost structure 220 that generates a middle voltage for read operations. Two transistors 225, 230 are coupled between the charge pump 210 and boost structure 220 to selectively provide or multiplex the high and middle voltages as an output 235. In further embodiments, different circuits may be used to provide the two different levels of voltages if desired. A logic module 240 is coupled to a gate of each of the transistors 225, 230 or other type of switch, to control which voltage is provided. For programming, transistor 225 is on and transistor 230 is off. For reading, transistors 225 is off, and transistor 230 is on.

An oscillator 245 is used to generate clock signals (clk at 246) for the charge pump 210 and boost structure 220 in one embodiment. The middle voltage may be generated either during power up or during re-initialization after each programming operation of the array 110. The delay for such operations is long compared to the time used to generate the middle voltage. A low frequency oscillator 250 is used to maintain the middle voltage.

During stand-by mode, transistor 225 is turned off by setting its gate voltage to the middle voltage. Oscillator 245, sometimes referred to as the main oscillator, is off in stand-by mode in order to minimize power consumption. In stand-by mode, the middle voltage decreases quickly because of leakages inherent in the use of smaller and denser features to obtain higher circuit densities. Transistor 230, and other high voltage devices have a threshold voltage higher than the low voltage devices, so their intrinsic leakage is very weak.

Also during stand-by mode, low frequency oscillator generates a clk_lf clock illustrated at 251, which is provided to a logic module 255. Logic module 255 is coupled to oscillator 245, and provides pulses at 256, to oscillator 245. In one embodiment, a pulse is generated by logic 255 for each clock cycle of the low frequency oscillator 250. In further embodiments, different arrangements may be used to provide a lower frequency set of pulses to control operation of oscillator 245.

The oscillator 245 then provides the clk signal for the duration of each pulse 256, causing boost structure 220 to operate to maintain their middle voltages. It should be noted that the middle voltage is generated during the power up or at the end of programming when the oscillator 245 works fully and is independent of the pulse. The pulse in one embodiment serves only to trigger the oscillator 245 a short time to maintain the middle voltage. Thus, the low frequency oscillator 250 and logic 255 operate to cause the oscillator 245 to consume power for short durations of time during standby mode to maintain the middle voltage and minimize power consumption.

The low frequency oscillator 250 is used to maintain the middle voltage in stand-by mode in part because it consumes less power by operating at a low frequency, such as 30 KHz in one embodiment. Other frequencies may be used to obtain desired control of the middle voltage as a function of desired power consumption characteristics. The power consumption of the low frequency oscillator 250 may be negligible compared to the intrinsic leakage of the array 110 at high temperature, which is worst case.

In one embodiment, a large number of devices may be coupled to the output voltage Vmh at 235, so an intrinsic capacitance associated with Vmh 235 is strong. Further, the capacitance on the output of the boost structure 220 is small, because the middle voltage output is only connected to the drain of transistor 230.

Figure 3:
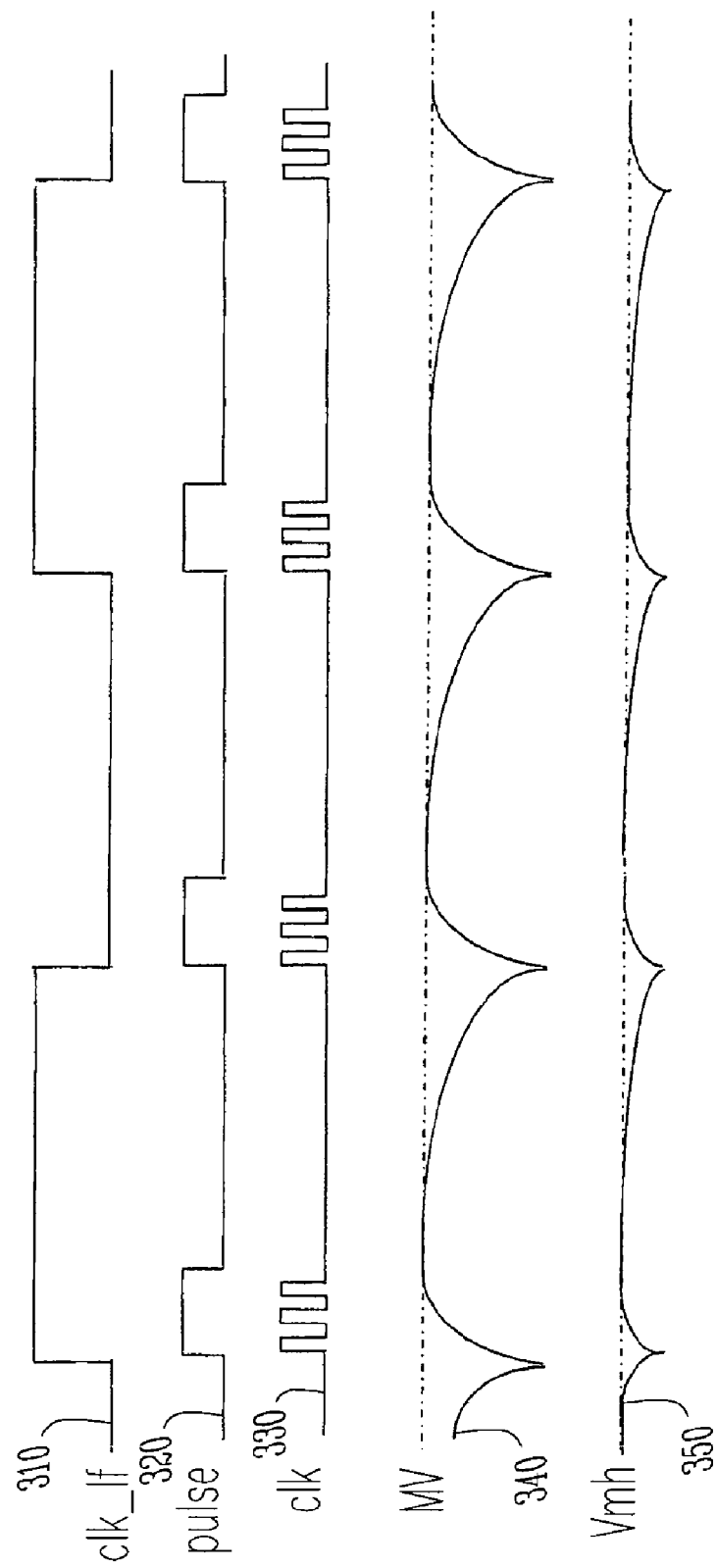
FIG. 3 is a timing diagram illustrating waveforms at internal nodes in the voltage generator structure of FIG. 2 according to an example embodiment.

FIG. 3 represents selected waveforms on internal nodes of high voltage generator 155, to illustrate how the middle voltage is maintained using the low frequency oscillator 250 and other components of high voltage generator 155. The clock, clk_lf 251 from the low frequency oscillator 250 is shown at waveform 310. Pulse 256 from logic 255 is shown at waveform 320. clk 246 from oscillator 245 is shown at 330. The middle voltage from boost structure 220 is shown at waveform 340, and the medium voltage that is to be maintained from boost 220 is shown at waveform 350.

When clk_lf switches at Vdd or 0, a pulse 256 is generated in one embodiment via logic 255. During the short pulse, oscillator 245, also referred to as an internal oscillator in one embodiment, is triggered and at the same time, transistor 230 is on during the short pulse (otherwise this transistor is off in standby mode), causing the middle voltage output as seen at waveform 340 to rise very quickly thanks to a charge transfer through transistor 230 and the boost structure 220. Vmh 235 recovers to the expected middle voltage, MV value. The MV value is ready to be used in bit line select 130 and word line driver blocks 120.

To summarize the operation of transistor 230 in one embodiment, in programming mode, transistor 230 is off. In reading mode, transistor 230 is on to provide and maintain the middle voltage. In stand-by mode, transistor 230 is off to avoid leakage, except during the pulse (boost triggered) to maintain the middle voltage. During a power-up, and at the end of programming, transistor 230 is on to provide the middle voltage.

Figure 4:
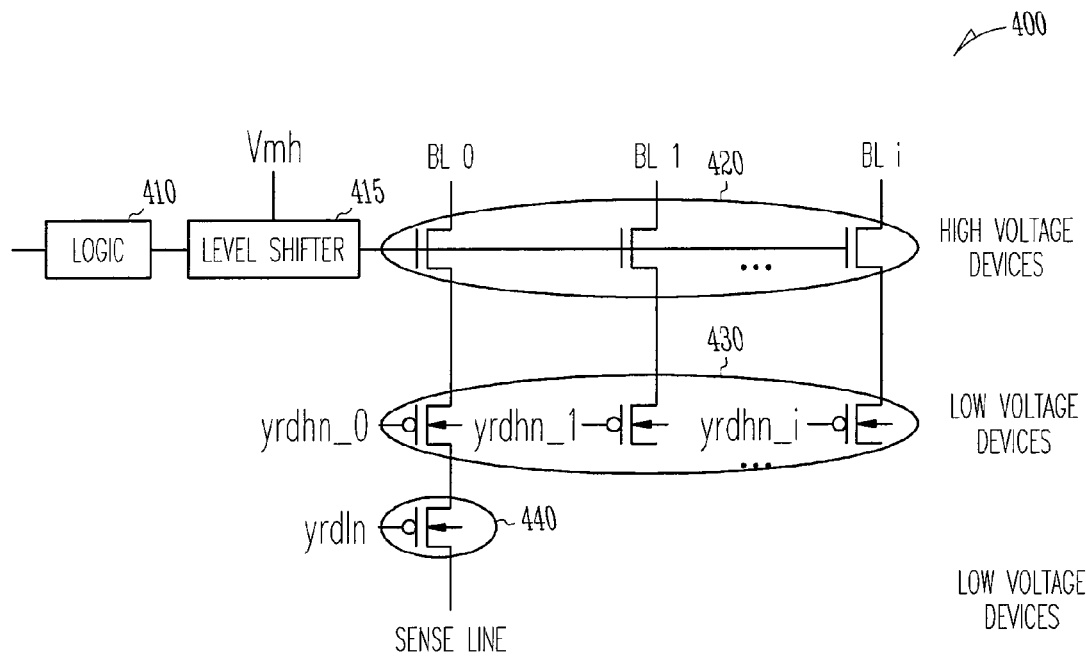
FIG. 4 is a block circuit diagram illustrating a bit line select block for the memory device of FIG. 1 according to an example embodiment.

FIG. 4 is a block diagram of an example bit line select block 400. A logic block 410 is used to select between different modes of operations. It is coupled to a level shifter 415, that receives Vmh from the voltage generator 155. The level shifter 415 shifts the voltage levels for the selected mode of operation, and is coupled to high voltage devices 420, each connected to a bit line in the array 110. In one embodiment, the high voltage devices 420 are Nmos transistors with their gates connected. The drain of Nmos transistors can reach high voltage levels (while their gates are to 0) during programming mode. During stand-by mode, the gates are supplied the middle voltage. These devices have a good drive thanks to the middle voltage applied on these gates and enable further shrinking of their width.

The high voltage devices 420 are respectively serially coupled to low voltage devices 430, such as Pmos devices, that are controlled by an inversed signal of yrdl, named yrdln. There is no degradation due to the threshold voltage with Pmos devices to pre-charge the bit line at 0.9V. The low voltage devices are used to decode selected words. The low voltage devices 430 have small capacitive properties and a large drive. A final low voltage device, such as a Pmos transistor 440 is used to couple each of the low voltage devices 430 to the sense amplifier 135.

It should be noted that in prior bit line select circuits, a level shifter may be required for each yrdh signal. Despite the big parasitic capacitor due to all the gates connected together of high voltage transistors in bit line select block 400, one common level shifter is sufficient to rise a common gate instead of a level shifter for each yrdh signal. The charge is done during the power-up mode or the re-initialization mode, and transistor 230 is on during these modes.

Figure 5:
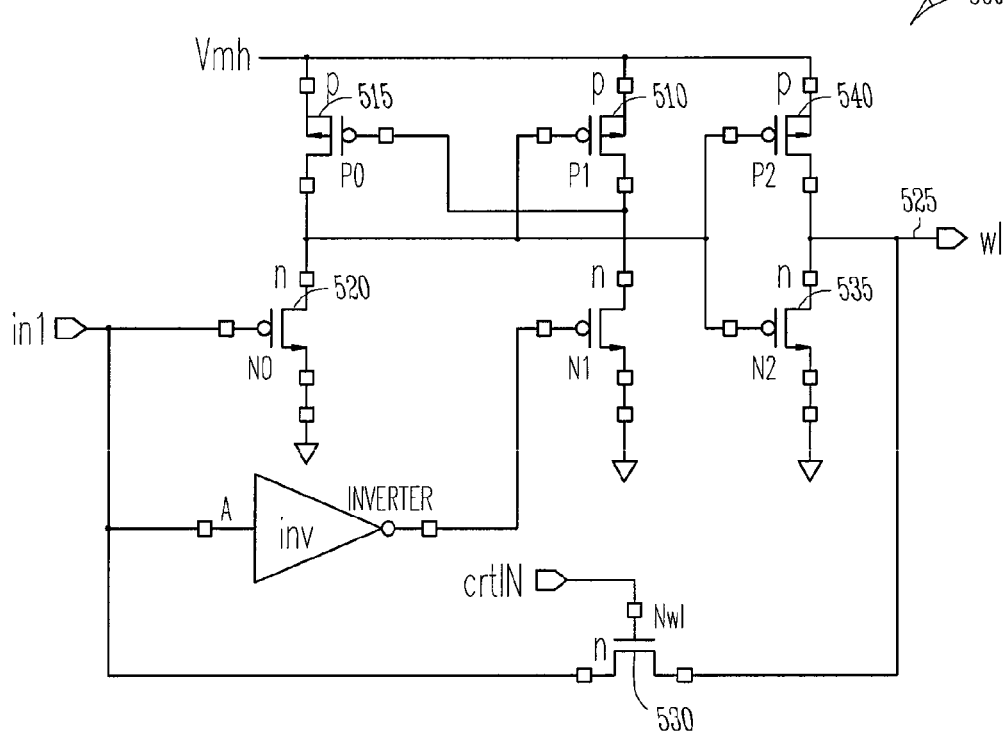
FIG. 5 is a block circuit diagram illustrating a word line driver block for the memory device of FIG. 1 according to an example embodiment.

An example word line driver block is illustrated at 500 in FIG. 5. Transistors 510, 515 and 520 are coupled to act as a level shifter. In an input, in1 to transistor 520 goes to Vdd, a word line, 525 will rise from 0 to Vmh. When a read operation starts, Vmh is already established to the middle voltage, so transistor 230 in FIG. 2, can more quickly charge the word line 525. A transistor 530 is coupled between the input and the word line 525 to help speed up the charging of the word line 525 until Vdd, but has difficulties in discharging the word line due to the weak voltage applied on its gate.

In one embodiment, an additional pair of transistors 535 and 540 may be added to the word line driver block. Transistor 535, whose gate is set to the middle voltage, easily discharges the word line to ground, allowing a decrease in the width of transistor 530. The size of the transistor 530 may be decreased significantly, and adding transistors 535 and 540 does not increase the overall area of the word line driver block 500.

Figure 6:
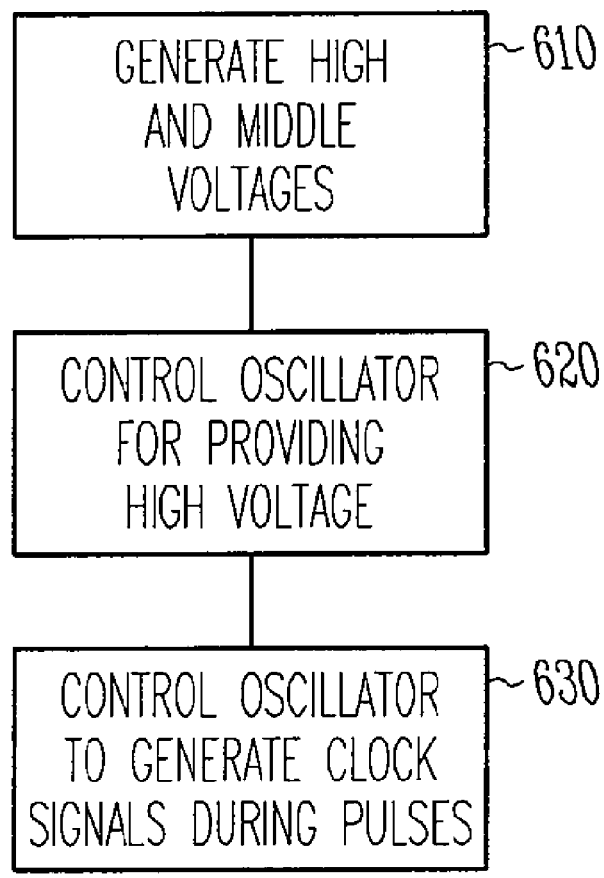
FIG. 6 is a flow chart illustrating a method of providing a voltage to a memory array according to an example embodiment.

FIG. 6 is a flow chart illustrating a method 600 of providing a voltage to a memory array according to an example embodiment. Method 600 includes generating a high voltage and a middle voltage for a memory array at 610. An oscillator is controlled to generate clock signals at 620 continuously for provision of the high voltage. The oscillator is controlled at 630 to generate clock signals during pulses provided at a frequency to reduce power consumption of the oscillator. The oscillator runs during the pulses and the middle voltage is maintained during a stand-by mode of operation.

In one embodiment, the pulses are provided at a frequency much lower than the frequency of the oscillator. The pulses may be provided as a function of a low frequency oscillator having a frequency much lower than the frequency of the oscillator. The pulses have a duration less than a period of the low frequency oscillator frequency. In one embodiment, the middle voltage is maintained when the oscillator is controlled to generate clock signals during the pulses. The oscillator runs continuously responsive to the clock signals and the high voltage is provided as an output during a program operation.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A device comprising:
a first voltage generator to generate a high voltage for programming memory cells in a memory array;
a second voltage generator to generate a middle voltage for reading memory cells in the memory array;
a controller to select between the high voltage and the middle voltage;
a first oscillator to generate a clock signal, the first oscillator coupled to the first and second voltage generators; and
a pulse generator coupled to the first oscillator for controlling operation of the first oscillator during a stand-by mode, wherein controlling operation of the first oscillator includes driving the clock signal generated by the first oscillator in response to pulses generated by the pulse generator.

2. The device of claim 1 wherein the pulse generator generates pulses at a frequency lower than the frequency of the first oscillator.

3. The device of claim 2 wherein the first oscillator provides the clock signal during each pulse.

4. The device of claim 3 wherein the first and second voltage generators operate as a function of the clock signal from the first oscillator.

5. The device of claim 1 wherein the pulse generator comprises a second oscillator operating at a lower frequency than the first oscillator, and wherein a pulse is generated for each cycle of the second oscillator.

6. The device of claim 1 wherein the controller operates to select the middle voltage during a stand-by mode of operation of the memory array.

7. The device of claim 6 and further comprising:
a bit line select block coupled to the middle voltage; and
a word line driver block coupled to the middle voltage.

8. A device comprising:
a charge pump to generate a high voltage for programming memory cells in a memory array;
a boost element to generate a middle voltage for reading memory cells in the memory array;
control logic and switches coupled to the charge pump and boost element to select between the high voltage and the middle voltage;
a first oscillator to generate clock signals for the charge pump and boost element;
a low frequency oscillator to generate clock signals at a lower frequency than the first oscillator; and
a pulse generator coupled to the low frequency oscillator to generate a pulse for each cycle of the low frequency oscillator and control the first oscillator to generate clock signals during such pulses.

9. The device of claim 8 wherein the boost element is coupled to provide the middle voltage when the device is in a standby mode.

10. The device of claim 9 and further comprising a bit line control circuit operable at the middle voltage during read operations.

11. The device of claim 9 and further comprising a word line control circuit coupled to the middle voltage.

12. A method comprising:
generating a high voltage for programming memory cells in a memory array and a middle voltage for reading memory cells in the memory array;
controlling an oscillator to generate clock signals for provision of the high voltage; and
controlling the oscillator to generate clock signals in response to pulses provided by a pulse generator at a frequency for reducing power consumption for provision of the middle voltage.

13. The method of claim 12 wherein the pulses are provided at a frequency much lower than the frequency of the oscillator.

14. The method of claim 13 wherein the pulses are provided as a function of a low frequency oscillator having a frequency much lower than the frequency of the oscillator.

15. The method of claim 14 wherein the pulses have a duration less than a period of the low frequency oscillator frequency.

16. The method of claim 15 and further comprising providing the middle voltage when the oscillator is controlled to generate clock signals during the pulses.

17. The method of claim 12 wherein the oscillator runs responsive to the clock signals for provision of the high voltage and the high voltage is provided as an output during a program operation.

18. The method of claim 12 wherein the oscillator runs during the pulses and the middle voltage is maintained during a stand-by mode of operation.

19. The device of claim 1 wherein controlling operation of the first oscillator further includes preventing output of the clock signal from the first oscillator between pulses.

20. The method of claim 12 wherein no clock signal is output from the oscillator between pulses during provision of the middle voltage.

* * * * *